United States Patent
Huang et al.

(10) Patent No.: US 10,299,368 B2
(45) Date of Patent: May 21, 2019

(54) SURFACE INTEGRATED WAVEGUIDES AND CIRCUIT STRUCTURES THEREFOR

(71) Applicant: Invensas Corporation, San Jose, CA (US)

(72) Inventors: Shaowu Huang, Sunnyvale, CA (US); Javier A. Delacruz, San Jose, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 15/387,278

(22) Filed: Dec. 21, 2016

(65) Prior Publication Data

US 2018/0177041 A1    Jun. 21, 2018

(51) Int. Cl.

| | |
|---|---|
| *H01P 1/207* | (2006.01) |
| *H05K 1/02* | (2006.01) |
| *H05K 3/30* | (2006.01) |
| *H01P 1/208* | (2006.01) |
| *H01P 3/12* | (2006.01) |
| *H01P 1/39* | (2006.01) |

(Continued)

(52) U.S. Cl.
CPC ........... *H05K 1/0228* (2013.01); *H01P 1/207* (2013.01); *H01P 1/2088* (2013.01); *H01P 3/121* (2013.01); *H05K 3/30* (2013.01); *H01L 2224/48091* (2013.01); *H01L 2224/48227* (2013.01); *H01P 1/39* (2013.01); *H01P 5/19* (2013.01); *H01P 7/065* (2013.01); *H01P 11/002* (2013.01); *H01Q 13/18* (2013.01); *H05K 2201/10287* (2013.01)

(58) Field of Classification Search
CPC .. H01P 1/207; H01P 1/12; H01P 1/121; H01P 1/122

USPC ................. 333/239, 208, 209, 248
See application file for complete search history.

(56) References Cited

U.S. PATENT DOCUMENTS

| | | | |
|---|---|---|---|
| 2,230,663 | A | 2/1941 | Alden |
| 3,289,452 | A | 12/1966 | Koellner |

(Continued)

FOREIGN PATENT DOCUMENTS

| | | | |
|---|---|---|---|
| CN | 1352804 | A | 6/2002 |
| CN | 1641832 | A | 7/2005 |

(Continued)

OTHER PUBLICATIONS

Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.

(Continued)

*Primary Examiner* — Stephen E. Jones

(57) ABSTRACT

Apparatus, and corresponding method, relates generally to a microelectronic device. In such an apparatus, a first conductive layer is for providing a lower interior surface of a circuit structure. A plurality of wire bond wires are interconnected to the lower interior surface and spaced apart from one another for providing at least one side of the circuit structure. A second conductive layer is for providing an upper interior surface of the circuit structure spaced apart from the lower interior surface by and interconnected to the plurality of wire bond wires. The plurality of wire bond wires, the first conductive layer and the second conductive layer in combination define at least one opening in the at least one side for a signal port of the circuit structure. Such circuit structure may be a signal guide circuit structure, such as for a signal waveguide or signal cavity for example.

12 Claims, 9 Drawing Sheets

(51) Int. Cl.
  *H01P 5/19* (2006.01)
  *H01P 7/06* (2006.01)
  *H01P 11/00* (2006.01)
  *H01Q 13/18* (2006.01)

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,867,267 A | 9/1989 | Carlson |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,977,640 A | 11/1999 | Bertin et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |

(56) References Cited

U.S. PATENT DOCUMENTS

| | | |
|---|---|---|
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,472,743 B2 | 10/2002 | Huang et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 2/2003 | Chew et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,555,918 B2 | 4/2003 | Masuda et al. |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,741,085 B1 | 5/2004 | Khandros et al. |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,317 B2 | 8/2004 | Fjelstad |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,780,746 B2 | 8/2004 | Kinsman et al. |
| 6,787,926 B2 | 9/2004 | Chen et al. |
| 6,790,757 B1 | 9/2004 | Chittipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,262,506 B2 | 8/2007 | Mess et al. |
| 7,268,421 B1 | 9/2007 | Lin |
| 7,276,785 B2 | 10/2007 | Bauer et al. |
| 7,276,799 B2 | 10/2007 | Lee et al. |
| 7,287,322 B2 | 10/2007 | Mehieu et al. |
| 7,290,448 B2 | 11/2007 | Shirasaka et al. |
| 7,294,920 B2 | 11/2007 | Chen et al. |

(56) References Cited

U.S. PATENT DOCUMENTS

| | | |
|---|---|---|
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,378,726 B2 | 5/2008 | Punzalan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,485,969 B2 | 2/2009 | Corisis et al. |
| 7,495,179 B2 | 2/2009 | Kubota et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,528,474 B2 | 5/2009 | Lee |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,560,360 B2 | 7/2009 | Cheng et al. |
| 7,564,116 B2 | 7/2009 | Ahn et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,605,479 B2 | 10/2009 | Mohammed |
| 7,612,638 B2 | 11/2009 | Chung et al. |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,670,940 B2 | 3/2010 | Mizukoshi et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,683,482 B2 | 3/2010 | Nishida et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,800,233 B2 | 9/2010 | Kawano et al. |
| 7,807,512 B2 | 10/2010 | Lee et al. |
| 7,808,093 B2 | 10/2010 | Kagaya et al. |
| 7,808,439 B2 | 10/2010 | Yang et al. |
| 7,815,323 B2 | 10/2010 | Saeki |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,876,180 B2 | 1/2011 | Uchimura |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,910,385 B2 | 3/2011 | Kweon et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 8,008,121 B2 | 8/2011 | Choi et al. |
| 8,012,797 B2 | 9/2011 | Shen et al. |
| 8,017,437 B2 | 9/2011 | Yoo et al. |
| 8,017,452 B2 | 9/2011 | Ishihara et al. |
| 8,018,033 B2 | 9/2011 | Moriya |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |

(56) References Cited

U.S. PATENT DOCUMENTS

| | | | |
|---|---|---|---|
| 8,080,445 | B1 | 12/2011 | Pagaila |
| 8,084,867 | B2 | 12/2011 | Tang et al. |
| 8,092,734 | B2 | 1/2012 | Jiang et al. |
| 8,093,697 | B2 | 1/2012 | Haba et al. |
| 8,106,498 | B2 | 1/2012 | Shin et al. |
| 8,115,283 | B1 | 2/2012 | Bolognia et al. |
| 8,119,516 | B2 | 2/2012 | Endo |
| 8,120,054 | B2 | 2/2012 | Seo et al. |
| 8,120,186 | B2 | 2/2012 | Yoon |
| 8,138,584 | B2 | 3/2012 | Wang et al. |
| 8,143,141 | B2 | 3/2012 | Sun et al. |
| 8,143,710 | B2 | 3/2012 | Cho |
| 8,158,888 | B2 | 4/2012 | Shen et al. |
| 8,169,065 | B2 | 5/2012 | Kohl et al. |
| 8,174,119 | B2 | 5/2012 | Pendse |
| 8,183,682 | B2 | 5/2012 | Groenhuis et al. |
| 8,183,684 | B2 | 5/2012 | Nakazato |
| 8,193,034 | B2 | 6/2012 | Pagaila et al. |
| 8,194,411 | B2 | 6/2012 | Leung et al. |
| 8,198,716 | B2 | 6/2012 | Periaman et al. |
| 8,207,604 | B2 | 6/2012 | Haba et al. |
| 8,213,184 | B2 | 7/2012 | Knickerbocker |
| 8,217,502 | B2 | 7/2012 | Ko |
| 8,225,982 | B2 | 7/2012 | Pirkle et al. |
| 8,232,141 | B2 | 7/2012 | Choi et al. |
| 8,237,257 | B2 | 8/2012 | Yang |
| 8,258,010 | B2 | 9/2012 | Pagaila et al. |
| 8,258,015 | B2 | 9/2012 | Chow et al. |
| 8,263,435 | B2 | 9/2012 | Choi et al. |
| 8,264,091 | B2 | 9/2012 | Cho et al. |
| 8,269,335 | B2 | 9/2012 | Osumi |
| 8,278,746 | B2 | 10/2012 | Ding et al. |
| 8,288,854 | B2 | 10/2012 | Weng et al. |
| 8,293,580 | B2 | 10/2012 | Kim et al. |
| 8,299,368 | B2 | 10/2012 | Endo |
| 8,304,900 | B2 | 11/2012 | Jang et al. |
| 8,314,492 | B2 | 11/2012 | Egawa |
| 8,315,060 | B2 | 11/2012 | Morikita et al. |
| 8,318,539 | B2 | 11/2012 | Cho et al. |
| 8,319,338 | B1 | 11/2012 | Berry et al. |
| 8,324,633 | B2 | 12/2012 | McKenzie et al. |
| 8,330,272 | B2 | 12/2012 | Haba |
| 8,349,735 | B2 | 1/2013 | Pagaila et al. |
| 8,354,297 | B2 | 1/2013 | Pagaila et al. |
| 8,362,620 | B2 | 1/2013 | Pagani |
| 8,372,741 | B1 | 2/2013 | Co et al. |
| 8,390,108 | B2 | 3/2013 | Cho et al. |
| 8,390,117 | B2 | 3/2013 | Shimizu et al. |
| 8,395,259 | B2 | 3/2013 | Eun |
| 8,399,972 | B2 | 3/2013 | Hoang et al. |
| 8,404,520 | B1 | 3/2013 | Chau et al. |
| 8,409,922 | B2 | 4/2013 | Camacho et al. |
| 8,415,704 | B2 | 4/2013 | Ivanov et al. |
| 8,419,442 | B2 | 4/2013 | Horikawa et al. |
| 8,435,899 | B2 | 5/2013 | Miyata et al. |
| 8,450,839 | B2 | 5/2013 | Corisis et al. |
| 8,476,115 | B2 | 7/2013 | Choi et al. |
| 8,476,770 | B2 | 7/2013 | Shao et al. |
| 8,482,111 | B2 | 7/2013 | Haba |
| 8,487,421 | B2 | 7/2013 | Sato et al. |
| 8,492,201 | B2 | 7/2013 | Pagaila et al. |
| 8,502,387 | B2 | 8/2013 | Choi et al. |
| 8,507,297 | B2 | 8/2013 | Iida et al. |
| 8,508,045 | B2 | 8/2013 | Khan et al. |
| 8,518,746 | B2 | 8/2013 | Pagaila et al. |
| 8,520,396 | B2 | 8/2013 | Schmidt et al. |
| 8,525,214 | B2 | 9/2013 | Lin et al. |
| 8,525,314 | B2 | 9/2013 | Haba et al. |
| 8,525,318 | B1 | 9/2013 | Kim et al. |
| 8,552,556 | B1 | 10/2013 | Kim et al. |
| 8,558,379 | B2 | 10/2013 | Kwon |
| 8,558,392 | B2 | 10/2013 | Chua et al. |
| 8,564,141 | B2 | 10/2013 | Lee et al. |
| 8,567,051 | B2 | 10/2013 | Val |
| 8,569,892 | B2 | 10/2013 | Mori et al. |
| 8,580,607 | B2 | 11/2013 | Haba |
| 8,598,717 | B2 | 12/2013 | Masuda |
| 8,618,646 | B2 | 12/2013 | Sasaki et al. |
| 8,618,659 | B2 | 12/2013 | Sato et al. |
| 8,624,374 | B2 | 1/2014 | Ding et al. |
| 8,633,059 | B2 | 1/2014 | Do et al. |
| 8,637,991 | B2 | 1/2014 | Haba |
| 8,642,393 | B1 | 2/2014 | Yu et al. |
| 8,646,508 | B2 | 2/2014 | Kawada |
| 8,653,626 | B2 | 2/2014 | Lo et al. |
| 8,653,668 | B2 | 2/2014 | Uno et al. |
| 8,653,676 | B2 | 2/2014 | Kim et al. |
| 8,659,164 | B2 | 2/2014 | Haba |
| 8,664,780 | B2 | 3/2014 | Han et al. |
| 8,669,646 | B2 | 3/2014 | Tabatabai et al. |
| 8,670,261 | B2 | 3/2014 | Crisp et al. |
| 8,680,662 | B2 | 3/2014 | Haba et al. |
| 8,680,677 | B2 | 3/2014 | Wyland |
| 8,680,684 | B2 | 3/2014 | Haba et al. |
| 8,685,792 | B2 | 4/2014 | Chow et al. |
| 8,686,570 | B2 | 4/2014 | Semmelmeyer et al. |
| 8,697,492 | B2 | 4/2014 | Haba et al. |
| 8,723,307 | B2 | 5/2014 | Jiang et al. |
| 8,728,865 | B2 | 5/2014 | Haba et al. |
| 8,729,714 | B1 | 5/2014 | Meyer |
| 8,742,576 | B2 | 6/2014 | Thacker et al. |
| 8,742,597 | B2 | 6/2014 | Nickerson |
| 8,766,436 | B2 | 7/2014 | Delucca et al. |
| 8,772,152 | B2 | 7/2014 | Co et al. |
| 8,772,817 | B2 | 7/2014 | Yao |
| 8,785,245 | B2 | 7/2014 | Kim |
| 8,791,575 | B2 | 7/2014 | Oganesian et al. |
| 8,791,580 | B2 | 7/2014 | Park et al. |
| 8,796,135 | B2 | 8/2014 | Oganesian et al. |
| 8,796,846 | B2 | 8/2014 | Lin et al. |
| 8,802,494 | B2 | 8/2014 | Lee et al. |
| 8,810,031 | B2 | 8/2014 | Chang et al. |
| 8,811,055 | B2 | 8/2014 | Yoon |
| 8,816,404 | B2 | 8/2014 | Kim et al. |
| 8,816,505 | B2 | 8/2014 | Mohammed et al. |
| 8,835,228 | B2 | 9/2014 | Mohammed |
| 8,836,136 | B2 | 9/2014 | Chau et al. |
| 8,836,140 | B2 | 9/2014 | Ma et al. |
| 8,836,147 | B2 | 9/2014 | Uno et al. |
| 8,841,765 | B2 | 9/2014 | Haba et al. |
| 8,846,521 | B2 | 9/2014 | Sugizaki |
| 8,847,376 | B2 | 9/2014 | Oganesian et al. |
| 8,853,558 | B2 | 10/2014 | Gupta et al. |
| 8,878,353 | B2 | 11/2014 | Haba et al. |
| 8,884,416 | B2 | 11/2014 | Lee et al. |
| 8,893,380 | B2 | 11/2014 | Kim et al. |
| 8,907,466 | B2 | 12/2014 | Haba |
| 8,907,500 | B2 | 12/2014 | Haba et al. |
| 8,912,651 | B2 | 12/2014 | Yu et al. |
| 8,916,781 | B2 | 12/2014 | Haba et al. |
| 8,922,005 | B2 | 12/2014 | Hu et al. |
| 8,923,004 | B2 | 12/2014 | Low et al. |
| 8,927,337 | B2 | 1/2015 | Haba et al. |
| 8,937,309 | B2 | 1/2015 | England et al. |
| 8,940,630 | B2 | 1/2015 | Damberg et al. |
| 8,940,636 | B2 | 1/2015 | Pagaila et al. |
| 8,946,757 | B2 | 2/2015 | Mohammed et al. |
| 8,948,712 | B2 | 2/2015 | Chen et al. |
| 8,963,339 | B2 | 2/2015 | He et al. |
| 8,970,049 | B2 | 3/2015 | Kamezos |
| 8,975,726 | B2 | 3/2015 | Chen |
| 8,978,247 | B2 | 3/2015 | Yang et al. |
| 8,981,559 | B2 | 3/2015 | Hsu et al. |
| 8,987,132 | B2 | 3/2015 | Gruber et al. |
| 8,988,895 | B2 | 3/2015 | Mohammed et al. |
| 8,993,376 | B2 | 3/2015 | Camacho et al. |
| 9,006,031 | B2 | 4/2015 | Camacho et al. |
| 9,012,263 | B1 | 4/2015 | Mathew et al. |
| 9,041,227 | B2 | 5/2015 | Chau et al. |
| 9,054,095 | B2 | 6/2015 | Pagaila |
| 9,082,763 | B2 | 7/2015 | Yu et al. |
| 9,093,435 | B2 | 7/2015 | Sato et al. |
| 9,095,074 | B2 | 7/2015 | Haba et al. |
| 9,105,483 | B2 | 8/2015 | Chau et al. |

(56) References Cited

U.S. PATENT DOCUMENTS

| | | |
|---|---|---|
| 9,105,552 B2 | 8/2015 | Yu et al. |
| 9,117,811 B2 | 8/2015 | Zohni |
| 9,123,664 B2 | 9/2015 | Haba |
| 9,128,123 B2 | 9/2015 | Liu et al. |
| 9,136,254 B2 | 9/2015 | Zhao et al. |
| 9,142,586 B2 | 9/2015 | Wang et al. |
| 9,153,562 B2 | 10/2015 | Haba et al. |
| 9,167,710 B2 | 10/2015 | Mohammed et al. |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,449 B2 | 4/2016 | Hasch et al. |
| 9,318,452 B2 | 4/2016 | Chen et al. |
| 9,324,696 B2 | 4/2016 | Choi et al. |
| 9,330,945 B2 | 5/2016 | Song et al. |
| 9,349,706 B2 | 5/2016 | Co et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,405,064 B2 | 8/2016 | Herbsommer et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,508,622 B2 | 11/2016 | Higgins |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 9,735,084 B2 | 8/2017 | Katkar et al. |
| 2001/0042925 A1 | 11/2001 | Yamamoto et al. |
| 2002/0014004 A1 | 2/2002 | Beaman et al. |
| 2002/0125556 A1 | 9/2002 | Oh et al. |
| 2002/0171152 A1 | 11/2002 | Miyazaki |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0162378 A1 | 8/2003 | Mikami |
| 2004/0041757 A1 | 3/2004 | Yang et al. |
| 2004/0262728 A1 | 12/2004 | Sterrett et al. |
| 2005/0017369 A1 | 1/2005 | Clayton et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0161814 A1 | 7/2005 | Mizukoshi et al. |
| 2005/0173807 A1 | 8/2005 | Zhu et al. |
| 2005/0176233 A1 | 8/2005 | Joshi et al. |
| 2006/0087013 A1 | 4/2006 | Hsieh |
| 2006/0216868 A1 | 9/2006 | Yang et al. |
| 2006/0255449 A1 | 11/2006 | Lee et al. |
| 2007/0010086 A1 | 1/2007 | Hsieh |
| 2007/0080360 A1 | 4/2007 | Mirsky et al. |
| 2007/0164457 A1 | 7/2007 | Yamaguchi et al. |
| 2007/0190747 A1 | 8/2007 | Hup |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0042265 A1 | 2/2008 | Merilo et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0217708 A1 | 9/2008 | Reisner et al. |
| 2008/0246126 A1 | 10/2008 | Bowles et al. |
| 2008/0280393 A1 | 11/2008 | Lee et al. |
| 2008/0284045 A1 | 11/2008 | Gerber et al. |
| 2008/0303153 A1 | 12/2008 | Oi et al. |
| 2008/0308305 A1 | 12/2008 | Kawabe |
| 2009/0008796 A1 | 1/2009 | Eng et al. |
| 2009/0014876 A1 | 1/2009 | Youn et al. |
| 2009/0032913 A1 | 2/2009 | Haba |
| 2009/0072924 A1 | 3/2009 | Uchimura |
| 2009/0085185 A1 | 4/2009 | Byun et al. |
| 2009/0091009 A1 | 4/2009 | Corisis et al. |
| 2009/0102063 A1 | 4/2009 | Lee et al. |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0256229 A1 | 10/2009 | Ishikawa et al. |
| 2009/0315579 A1 | 12/2009 | Beaman et al. |
| 2010/0032822 A1 | 2/2010 | Liao et al. |
| 2010/0044860 A1 | 2/2010 | Haba et al. |
| 2010/0078795 A1 | 4/2010 | Dekker et al. |
| 2010/0193937 A1 | 8/2010 | Nagamatsu et al. |
| 2010/0200981 A1 | 8/2010 | Huang et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0042699 A1 | 2/2011 | Park et al. |
| 2011/0068478 A1 | 3/2011 | Pagaila et al. |

(56) References Cited

U.S. PATENT DOCUMENTS

| | | |
|---|---|---|
| 2011/0157834 A1 | 6/2011 | Wang |
| 2011/0209908 A1 | 9/2011 | Lin et al. |
| 2011/0215472 A1 | 9/2011 | Chandrasekaran |
| 2012/0001336 A1 | 1/2012 | Zeng et al. |
| 2012/0043655 A1 | 2/2012 | Khor et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0126431 A1 | 5/2012 | Kim et al. |
| 2012/0153444 A1 | 6/2012 | Haga et al. |
| 2012/0184116 A1 | 7/2012 | Pawlikowski et al. |
| 2013/0001797 A1 | 1/2013 | Choi et al. |
| 2013/0040423 A1 | 2/2013 | Tung |
| 2013/0049218 A1 | 2/2013 | Gong et al. |
| 2013/0087915 A1 | 4/2013 | Warren et al. |
| 2013/0153646 A1 | 6/2013 | Ho |
| 2013/0200524 A1 | 8/2013 | Han et al. |
| 2013/0234317 A1 | 9/2013 | Chen et al. |
| 2013/0256847 A1 | 10/2013 | Park et al. |
| 2013/0265732 A1 | 10/2013 | Herbsommer et al. |
| 2013/0323409 A1 | 12/2013 | Read et al. |
| 2013/0328178 A1 | 12/2013 | Bakalski et al. |
| 2014/0035892 A1 | 2/2014 | Shenoy et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0225248 A1 | 8/2014 | Henderson et al. |
| 2014/0239479 A1 | 8/2014 | Start |
| 2014/0239490 A1 | 8/2014 | Wang |
| 2014/0308907 A1 | 10/2014 | Chen |
| 2014/0312503 A1 | 10/2014 | Seo |
| 2015/0044823 A1 | 2/2015 | Mohammed |
| 2015/0048471 A1 | 2/2015 | Hasch et al. |
| 2015/0076714 A1 | 3/2015 | Haba et al. |
| 2015/0130054 A1 | 5/2015 | Lee et al. |
| 2015/0206865 A1 | 7/2015 | Yu et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0200566 A1 | 7/2016 | Ofner et al. |
| 2016/0225692 A1 | 8/2016 | Kim et al. |
| 2017/0117231 A1 | 4/2017 | Awujoola et al. |
| 2017/0229432 A1 | 10/2017 | Lin et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 A | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10135220 A | 5/1998 |
| JP | H10135221 A | 5/1998 |
| JP | 11-074295 A | 3/1999 |
| JP | 11135663 A | 5/1999 |
| JP | H11-145323 A | 5/1999 |
| JP | 11251350 | 9/1999 |
| JP | H11260856 A | 9/1999 |
| JP | 11317476 | 11/1999 |
| JP | 2000156461 A | 6/2000 |
| JP | 2000323516 A | 11/2000 |
| JP | 3157134 B2 | 4/2001 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003197668 A | 7/2003 |
| JP | 2003307897 A | 10/2003 |
| JP | 2003318327 A | 11/2003 |
| JP | 2004031754 A | 1/2004 |
| JP | 2004047702 A | 2/2004 |
| JP | 2004048048 A | 2/2004 |
| JP | 2004-172157 A | 6/2004 |
| JP | 2004-200316 | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2007123595 | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 | 2/2009 |
| JP | 2009508324 A | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 A1 | 6/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 10-2007-0058680 A | 6/2007 |
| KR | 20080020069 A | 3/2008 |
| KR | 100865125 B1 | 10/2008 |
| KR | 20080094251 A | 10/2008 |
| KR | 100886100 B1 | 2/2009 |

(56) References Cited

FOREIGN PATENT DOCUMENTS

| | | | |
|---|---|---|---|
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 101215271 B1 | 12/2012 |
| KR | 20130048810 A | 5/2013 |
| KR | 20150012285 A | 2/2015 |
| TW | 200539406 A | 12/2005 |
| TW | 200721327 A | 6/2007 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| TW | I605558 B | 11/2017 |
| WO | 9615458 A1 | 5/1996 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2007116544 A1 | 10/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

International Search Report and Written Opinion for Appln. No. PCT/US2015/032679, dated Nov. 11, 2015.
International Search Report and Written Opinion for Appln. No. PCT/US2016/056526, dated Jan. 20, 2017.
International Search Report and Written Opinion for Appln. No. PCT/US2016/068297, dated Apr. 17, 2017.
Partial International Search Report for Appln. No. PCT/US2015/032679, dated Sep. 4, 2015.
Taiwan Search Report for 105128420, dated Sep. 26, 2017.
U.S. Appl. No. 13/477,532, mailed May 22, 2012.
U.S. Office Action for U.S. Appl. No. 12/769,930, dated May 5, 2011.
"Wafer Level Stack—WDoD", [online] [Retrieved Aug. 5, 2010] Retrieved from internet: <http://www.3d-plus.com/techno-wafer-level-stack-wdod.php>, 2 pages.
Written Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
International Search Report and Written Opinion for Appln. No. PCT/US2017/064437, dated Mar. 29, 2018.
Chinese Office Action Search Report for Application No. 2014800551784 dated Jan. 23, 2018.
European Search Report for Appln. No. EP12712792, dated Feb. 27, 2018, 2 pages.
International Search Report and Written Opinion for Appln. No. PCT/US2013/041981, dated Nov. 13, 2013.
International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Search Report and Written Opinion for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/STMicroelectronics France, May 21, 2010.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, [ISR Appln. No. PCT/US2012/060402, dated Feb. 21, 2013 provides concise stmt. of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003.
North Corporation, Processed intra-Layer Interconnection Material for PWBs [Etched Copper Bump with Copper Foil], NMBITM, Version 2001.6.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2013.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
Bang, U.S. Appl. No. 10/656,534, filed Sep. 5, 2003.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.

(56) References Cited

OTHER PUBLICATIONS

Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
EE Times Asia "3D Plus Wafer Level Stack" [online] [Retrieved Aug. 5, 2010] Retrieved from internet: <http://www.eetasia.com/ART_8800428222_280300_NT_DEC52276.htm>, 2 pages.
Extended European Search Report for Appln. No. EP13162975, dated Sep. 5, 2013.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
International Search Report and Written Opinion for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2013.
International Search Report and Written Opinion for Appln. No. PCT/US2013/026126, dated Jul. 25, 2013.
International Search Report and Written Opinion for Appln. No. PCT/US2013/052883, dated Oct. 21, 2013.
International Search Report and Written Opinion for co-pending PCT Application No. PCT/US2017/064437, filed Dec. 4, 2017, dated Mar. 29, 2018, 14 pages.

SURFACE INTEGRATED WAVEGUIDES AND CIRCUIT STRUCTURES THEREFOR

FIELD

The following description relates to microelectronic devices. More particularly, the following description relates to a circuit structure, such as a waveguide or cavity, having spaced-apart wire bond wires for at least one side thereof.

BACKGROUND

Conventionally, substrate-integrated waveguides ("SIWs") are formed by laser drilling holes in a dielectric substrate, including a printed circuit board, down to a lower metal layer. Such holes are filled with a metal to form metal posts, and an upper metal layer is formed over upper ends of such metal posts and on a presently exposed upper surface of such dielectric substrate to form an SIW. However, metal post-to-metal post spacing or pitch is limited to laser drilling spacings, which conventionally such pitch is at a minimum 350 microns. Photolithographic semiconductor processing may be used to form such metal posts with sub-350 micron pitches; however, photolithographic semiconductor processing is substantially more costly than laser drilling.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 1-2 is a line drawing of a front perspective view illustratively depicting another exemplary in-process microelectronic device.

FIG. 2-1 is a line drawing of a front perspective view illustratively depicting the exemplary microelectronic device of FIG. 1-1 with an upper conductive layer.

FIG. 2-2 is a line drawing of a front perspective view illustratively depicting the example microelectronic device of FIG. 2-1 with a signal guide dielectric layer.

FIG. 2-3 is a line drawing of a front perspective view illustratively depicting the example microelectronic device of FIG. 2-2 with an upper conductive layer.

FIG. 3 is a block diagram illustratively depicting a cross-sectional view of an exemplary system-integrated package ("SiP") having an upper surface integrated waveguide circuit structure for a microelectronic device.

DETAILED DESCRIPTION

Figure 1:
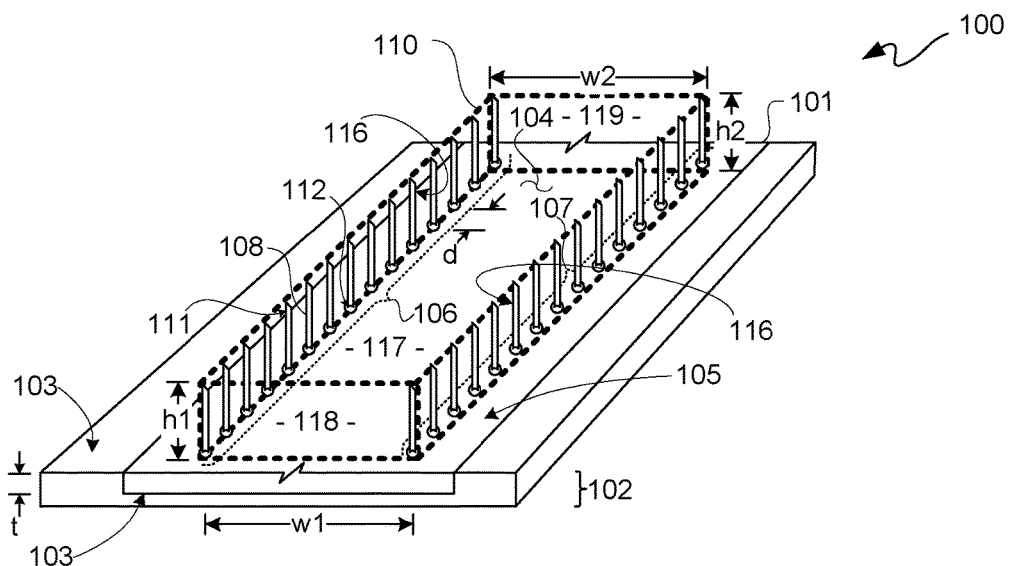
FIG. 1-1 is a line drawing of a front perspective view illustratively depicting an exemplary in-process microelectronic device.

In the following description, numerous specific details are set forth to provide a more thorough description of the specific examples described herein. It should be apparent, however, to one skilled in the art, that one or more other examples or variations of these examples may be practiced without all of the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Use of terms such as "upper" and "lower" or other directional terms is made with respect to the reference frame of the figures and is not meant to be limiting with respect to potential alternative orientations, such as in further assemblies or as used in various systems.

Before describing the examples illustratively depicted in the several figures, a general introduction is provided to further understanding.

Along those lines, prior to using wire bond wires as described herein, laser drilling and filling of holes in a substrate was used to form metal posts or bars of a waveguide cage as previously described. These types of conventional waveguides are commonly referred to as Substrate-Integrated Waveguides or SIWs. SIWs have been integrated into RF and microwave systems for example.

Conventional SIWs use laser drilled holes in a printed circuit board ("PCB") or other substrate, which are filled with a metal or other conductor to form metal posts or bars of a waveguide. Such metal posts may interconnect upper and lower conductive plates of an SIW. However, spacings between laser drilled holes of an SIW may conventionally only be as small as approximately 350 microns (0.35 millimeters ("mm")). This limits applications for such conventional SIWs to frequencies having wavelengths approximately equal to or greater than 3.5 millimeters (i.e., approximately 10×0.35 mm).

For higher frequencies with shorter wavelengths, a photolithographic semiconductor process may be used to form metal posts, namely plated or filled vias, with narrower spacings than approximately 350 microns. However, photolithographic semiconductor processing is substantially more expensive than laser drilling.

In contrast, forming a signal guide circuit structure as described in additional detail below by using wire bond wires allows for use of higher frequencies than that of conventional laser drill SIWs without the high cost of photolithographic semiconductor processing. Along those lines, signal guide circuit structures may be formed for higher frequencies than laser drilling and at less cost than photolithographic semiconductor processing. Moreover, wire bond wiring may be used as a replacement for laser drilling with respect to both cost and pitch. In addition, wire bond wiring can allow the top/bottom surface layers for signal routing, which is not capable for conventional SIWs that route only in internal layers of a package substrate or PCB.

As described below in additional detail, an apparatus relates generally to a microelectronic device. In such an apparatus, a first conductive layer is for providing a lower interior surface of a circuit structure. A plurality of wire bond wires are interconnected to the lower interior surface of the first conductive layer and spaced apart from one another for providing at least one side of the circuit structure. A second conductive layer is for providing an upper interior surface of the circuit structure. The upper interior surface and lower interior surface, which may be opposite one another, are spaced apart from one another by the plurality of wire bond wires. The plurality of wire bond wires are interconnected to the upper interior surface of the second conductive layer. The plurality of wire bond wires, the first conductive layer and the second conductive layer in combination define at least one opening in the at least one side for a signal port of the circuit structure.

As described below in additional detail, a method relates generally to forming a microelectronic device. In such a method, a first conductive layer is obtained for providing a lower interior surface of a circuit structure. A plurality of wire bond wires are interconnected to the lower interior surface of the first conductive layer and spaced apart from one another for providing at least one side of the circuit structure. A second conductive layer is formed for providing an upper interior surface of the circuit structure. The upper interior surface and lower interior surface, which may be opposite one another, are spaced apart from one another by the plurality of wire bond wires. The plurality of wire bond wires are interconnected to the upper interior surface of the second conductive layer. The plurality of wire bond wires, the first conductive layer and the second conductive layer in combination define at least one opening in the at least one side for a signal port of the circuit structure.

Other features will be recognized from consideration of the remainder of the Detailed Description and Claims, which follow.

FIG. 1-1 is a line drawing of a front perspective view illustratively depicting an exemplary in-process microelectronic device 100. Microelectronic device 100 may include a substrate 102 having a conductive layer 101. Conductive layer 101 may generally have a thickness t. Substrate 102 may be formed of a semiconductive or dielectric material.

Conductive layer 101 may be a conductive strip on an upper surface 103 of a substrate 102, or conductive layer 101 may be a conductive strip wholly or partially recessed in an upper surface 103 of a substrate 102. Conductive layer 101 may have a thickness, t, which may be one or more plated and/or deposited layers, a foil layer, a printed layer, an ink stamped layer, a vapor deposited layer or a combination thereof or the like for forming a metal or other conductive layer 101. Thickness t can be 1 or 2 or several microns, with generally thicker conductive layers providing better electrical performance.

A lower interior surface 104 of a circuit structure 110 may be at least a portion, if not all, of an upper surface 105 of conductive layer 101. Conductive layer 101 may have attached to upper surface 105 thereof a plurality of spaced apart wire bond wires 108 for providing at least one side of circuit structure 110. Such at least one side may provide an interior sidewall surface 116, one and/or all interior sides, of circuit structure 110.

In this example of a circuit structure 110, a first and a second plurality of spaced apart wire bond wires 108 form two spaced apart rows 106 and 107 of wire bond wires 108. Rows 106 and 107 are spaced apart by a distance w, which may be in a range may vary from application to application, but is generally at least greater than a half wavelength ($\lambda/2$) with respect to wavelength $\lambda$ of a signal input. Row 106 may provide a first interior sidewall surface 116 of circuit structure 110, and row 107 may provide a second interior sidewall surface 116 of circuit structure 110 opposite such first interior sidewall surface.

Lower ends 112 of wire bond wires 108 may be ball, stitch or other types of wire bond wire bonds for physical-mechanical attachment to upper surface 105 to define a lower interior surface. Tips or upper ends 111 of wire bond wires 108 may be physically-mechanically attached to another conductive layer, as described below in additional detail. Wire bond wires 108 of a plurality thereof, such as rows 106 and 107 for example, may be spaced apart from one another on center a distance d. Distance d may be approximately $\frac{1}{10}$ or smaller fraction of a wavelength $\lambda$ of a signal to be propagated in an interior region 117 defined by circuit structure 110, such as for millimeter or smaller wavelengths, as described below in additional detail.

Such circuit structure 110 may be a signal guide circuit structure, such as for a signal waveguide or signal cavity for a wavelength in the electromagnetic spectrum for example. In this example, circuit structure 110 is a waveguide for electromagnetic signals, as described below in additional detail. Though light is technically an electromagnetic signal, circuit structure 110 is not for propagation of light. In other implementations, other circuit structures may be implemented using at least one set of a plurality of spaced apart wire bond wires 108, such as for circuit structure 110 a cavity as illustratively depicted in the line drawing of FIG. 1-2 having a front perspective view illustratively depicting another exemplary in-process microelectronic device 100. While rectilinear circuit structures are illustratively depicted for purposes of clarity by way of example, rectilinear, non-rectilinear, or a combination thereof types of circuit structures may be used. In this example, a signal ingress end 118 of interior region 117 has a width w1 and a height h1, and a signal egress end 119 of interior region 117 has a width w2 and a height h2, where w1 and w2 are equal to one another and where h1 and h2 are equal to one another. In another example either or both w1 and w2 or h1 and h2 may be unequal to one another, such as for a horn circuit structure 110 for example. With reference to a cavity circuit structure 110 for example in FIG. 1-2, there may be a single signal path opening 114 into interior region 117 to provide a signal port, which may be for signal ingress and/or egress, of a circuit structure 110. Along those lines, a first set of wire bond wires 108, optionally a second set of wire bond wires 108, conductive layer 101, and another conductive layer (described below) in combination may define a first opening 118, and optionally a second opening 119, for at least one opening in at least one side for first signal port 118, and optionally a second signal port 119, respectively, of a circuit structure 110.

Generally, a plurality of wire bond wires 108 may be interconnected to a lower interior surface 104 of a lower or first conductive layer 101 and spaced apart from one another by a distance d for providing at least one side of a circuit structure 110 to define at least one opening 114 for a cavity, which includes a waveguide having at least two openings, in at least one side, which includes a waveguide having at least two sides. Such at least one opening may be for one or more electromagnetic signals with wavelengths in a range of approximately 0.5 to 1.5 mm for suppressing at least one of one or more forms of crosstalk, electromagnetic interference and/or electromagnetic radiation (hereinafter, electromagnetic interference and/or electromagnetic radiation is collectively and singly referred to as "electromagnetic radiation") with wavelengths longer than 1.5 mm, and certainly suppressing wavelengths longer than 3.5 mm as may be associated with laser drilled spacings. In another implementation, such at least one opening may be for one or more electromagnetic signals with wavelengths in a range of approximately 0.5 to 3.0 mm or 1.5 to 3.0 mm for suppressing at least one of crosstalk and/or electromagnetic radiation with wavelengths longer than 3.0 mm, and certainly suppressing wavelengths longer than 3.5 mm as may be associated with laser drilled spacings. However, as indicated above, wire bond wires 108 may additionally be used to supplant use of laser drilled and filled metal posts for longer wavelengths. For example, an uSIW circuit structure 110 may have wire bond wires 108 on a pitch for electromagnetic signals with wavelengths in a range of approximately 3 to 15 mm for suppressing at least one of crosstalk and/or electromagnetic radiation with wavelengths longer than 15 mm. These are just some examples, and other examples in accordance with the description herein may be used.

For purposes of clarity by way of example and not limitation, a waveguide circuit structure 110 with a dielectric for electromagnetic wave propagation is generally described below, though other types of circuit structures may be used in accordance with the description herein. Along those lines, an electromagnetic waveguide circuit structure 110 may be thought of as an "upper-Surface Integrated Waveguide" or "uSIW" so as to distinguish from a conventional SIW.

Figures 1, 2:
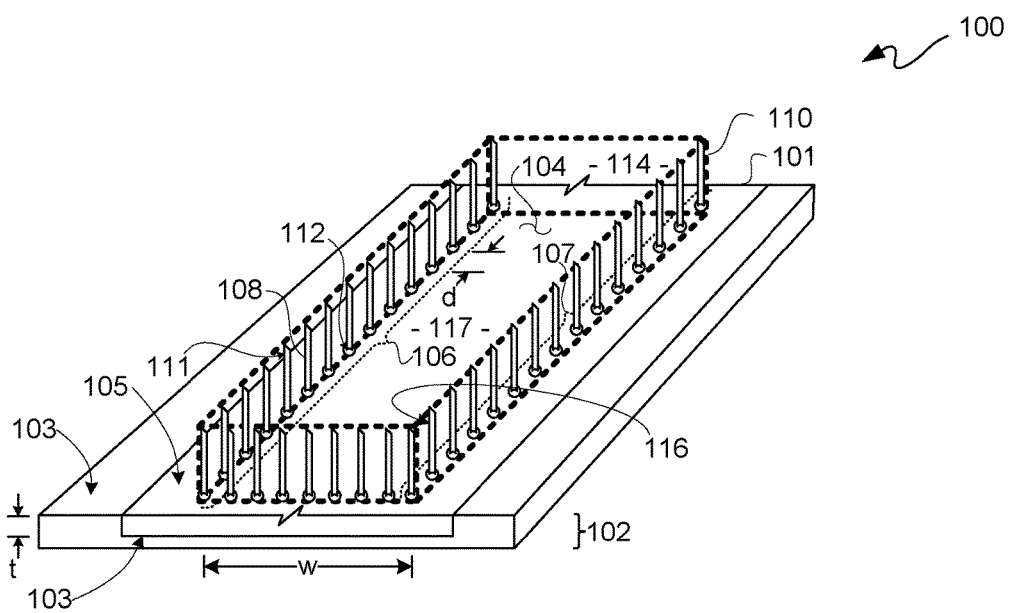

FIG. 2-1 is a line drawing of a front perspective view illustratively depicting the exemplary microelectronic device 100 of FIG. 1-1 with an upper conductive layer 121. With simultaneous reference to FIG. 1-1 through 2-1, microelectronic device 100 of FIG. 2-1 is further described.

A metal or other electrically conductive layer ("cover") 121 may be mechanically coupled to upper ends 111 for electrical conductivity. Cover 121 may provide another conductive layer for waveguide circuit structure 110 for providing an upper interior surface 122 on an underside of cover 121. Cover 121 is spaced apart from conductive layer 101 by heights of wire bond wires 108, so upper interior surface 122 is spaced apart from lower interior surface 104. Upper ends 111 of wire bond wires 108 are interconnect to upper interior surface 122. Upper interior surface 122 for defining an interior region 117 of waveguide circuit structure 110 may be directly opposite lower interior surface 104; however, in another implementation wire bond wires 108 may be slanted so upper interior surface 122 and lower interior surface 104 are not directly opposite one another, though portions respectively thereof may be directly opposite one another. In general, wire bond wires 108, conductive layer 101 and cover 121 in combination may define at least one signal path opening 114 into interior region 117 in at least one side provided by such wire bond wires 108 for a signal port of a circuit structure 110.

Upper and lower interior surfaces 122 and 104, respectively, may be interconnected to upper and lower ends 111 and 112 of wire bond wires 108, respectively, of such interior surfaces, where such wire bond wires 108 provide interior sidewall surfaces 116, for defining an interior region 117. Wire bond wires 108 may be used to interconnect for purposes of electrical conductivity upper and lower conductive surfaces, as well as provide interior sidewall surfaces 116 for forming a waveguide circuit structure 110 having bars, as opposed to solid walls, for defining sidewalls for openings 118 and 119. Again, spacings between wire bond wires 108 may be narrow with respect to a wavelength of a propagated signal.

Currently, bonded wire bond wires 108 may have on center spacings, or pitch, from one another in a range of approximately 50 to 150 microns (0.050 to 0.150 mm) on narrow-spacings end of a wire bonding pitch range. Along those lines, bonded wire bond wires 108 may be used for waveguide circuit structures 110 for signal wavelengths less than approximately 1.5 mm, such as in a range of approximately 500 to 1500 microns (i.e., 0.5 to 1.5 mm) for example. Spacing greater than 150 microns, including those in a range of approximately 150 to 300 microns, may likewise be used with wire bond wires 108. Furthermore, spacings greater than approximately 350 microns may be used with wire bond wires 108. Investment in wire bond tooling is not limited to applications for only frequencies higher than conventional laser drilling tooling, but may likewise displace laser drilling tooling for frequencies with wavelengths greater than approximately 3.5 mm.

Because wire bond wires 108 may have a smaller pitch than laser drilled holes, either or both openings for a signal ingress end 118 of a width w1 and a signal egress end 119 of interior region 117 of a width w2 may be less than a minimum pitch of laser drilled holes. Width w1 and/or w2 may be in a range of approximately 50 to 150 microns for having a narrow strip line interface thereto or therefrom for a circuit structure 110 with wire bond wires 108. Likewise, larger values may be used, such as in a range of approximately 150 to 300 microns for width w1 and/or w2 with corresponding strip line interfaces for a circuit structure 110 with wire bond wires 108.

Widths of ingress and/or egress openings of circuit structure 110 may be narrowly tailored for higher frequencies, so as to suppress frequencies with longer wavelengths from a wire bond wire 108 signal guide circuit structure 110. For example a wavelength of approximately 3 mm for approximately a 10 GHz signal or higher frequency may be allowed to pass into and/or out of a waveguide circuit structure 110, while lower frequencies may be filtered out by such waveguide circuit structure 110. This is just one of many examples of frequencies that may be used for a wire bond wire 108 signal guide circuit structure 110.

Another feature of using wire bond wires 108 may be an ability to form a circuit structure on an upper surface of a substrate without having to introduce another dielectric layer, as air may be used as a waveguide dielectric. As waveguides may occupy a substantial amount of surface area or volume of a substrate of an SIW, multiple layers may have to be introduced for an SIW to have adequate space for circuitry other than waveguides. This may increase overall thickness of an SIW product, which may preclude use in some thin profile packages.

Because wire bond wires 108 may be attached to an upper surface of a substrate having a conductive layer 101, layers of such substrate below such conductive layer 101 may not be affected by imposition of conductive layer 101. Conductive layer 101, as well as cover 121, is conventionally coupled to an earth ground or other zero potential sink. By using a uSIW circuit structure 110 and not having to add another layer to a multi-layer substrate to make additional room for a conventional SIW or another conventional SIW internal to such multi-layer substrate, an overall thinner product may result.

Because wire bond wires 108 may be more closely spaced than laser drilled and filled holes, such wire bond wires 108 coupled to upper and lower conductive layers, such as upper and lower conductive plates for example, may form an electromagnetic and/or radio frequency interference cage. Shielding from external interference may be provided to a signal in a circuit structure 110, and/or shielding from a signal in a circuit structure 110 may be provided to limit generation of external interference escaping from circuit structure 110.

Figures 1, 2:
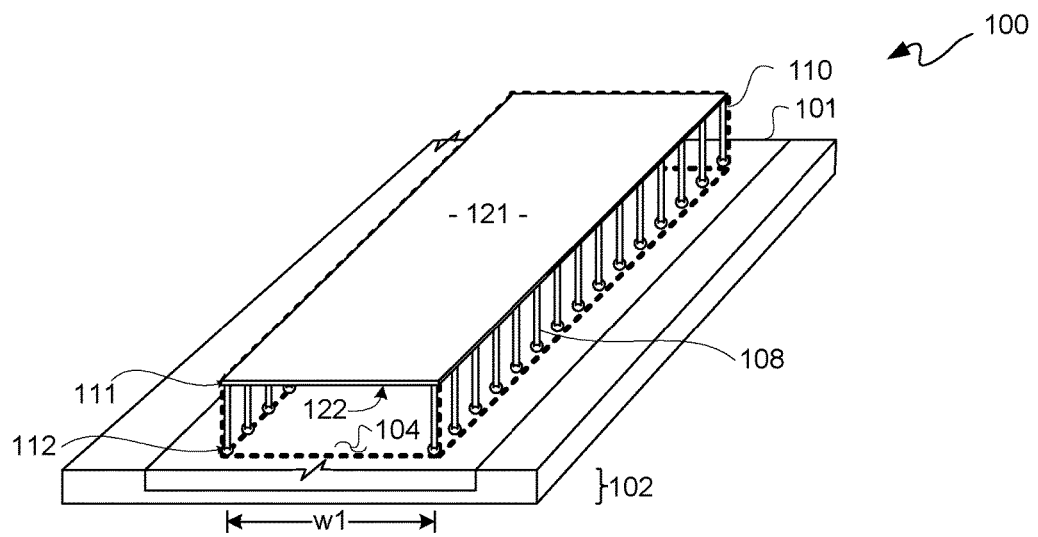
Figure 2:
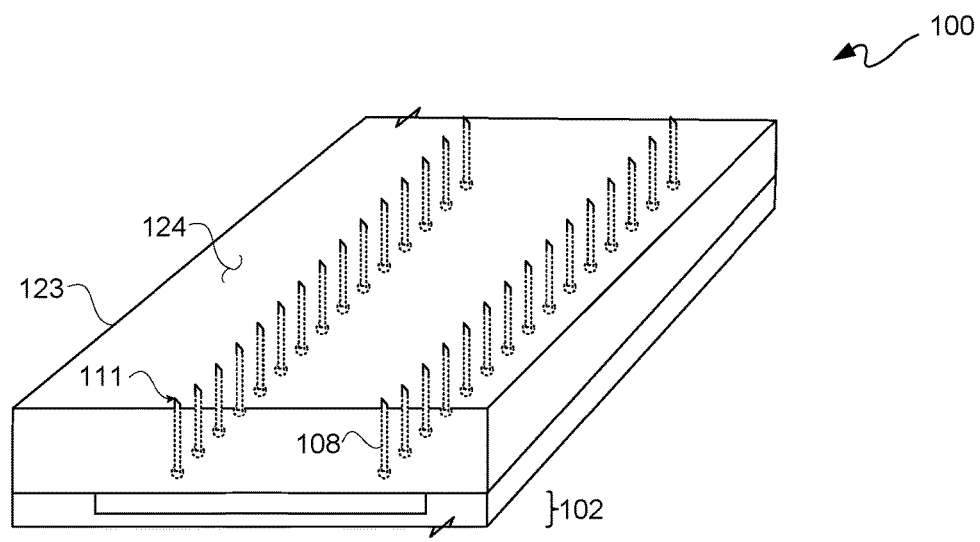
Figures 2, 3:
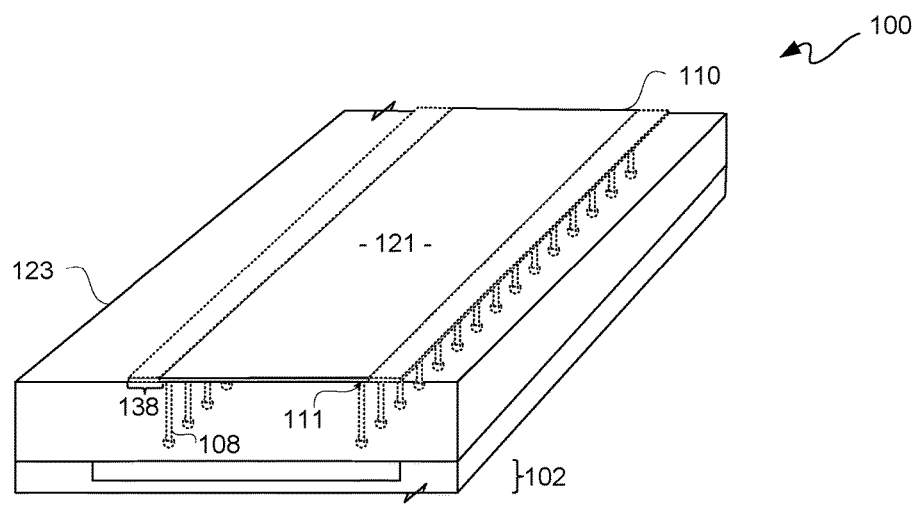
Figure 3:
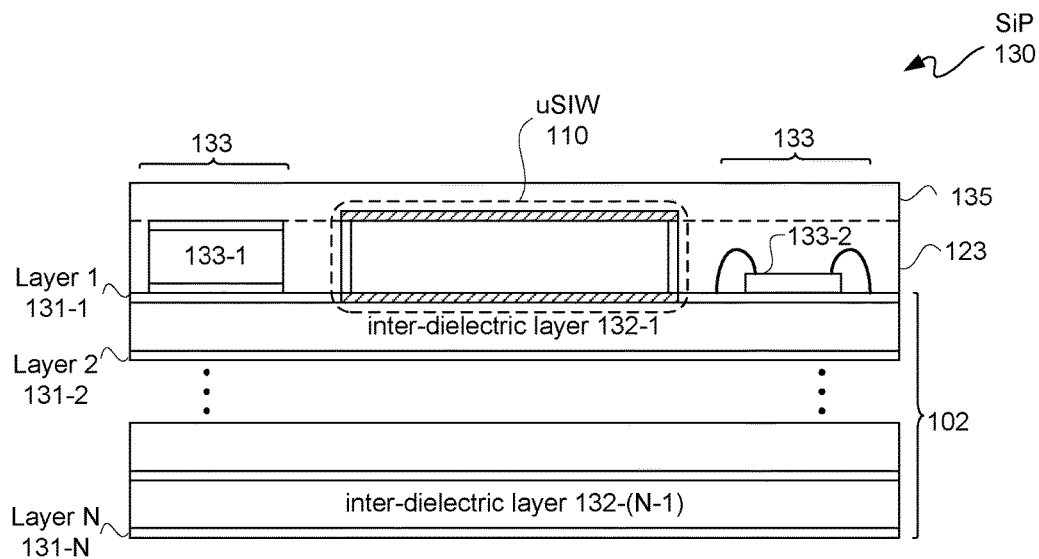

Use of wire bond wires 108 does not preclude implementation of a waveguide dielectric, which may be desirable for signal attenuation and/or other parameters for some applications. Along those lines, FIG. 2-2 is a line drawing of a front perspective view illustratively depicting the example microelectronic device 100 of FIG. 2-1 with a signal guide, such as a waveguide, dielectric layer. FIG. 2-3 is a line drawing of a front perspective view illustratively depicting the example microelectronic device 100 of FIG. 2-2 with an upper conductive layer. With simultaneous reference to FIG. 1-1 through 2-3, microelectronic device 100 of FIGS. 2-2 and 2-3 is further described.

Upper ends 111 of wire bond wires 108 may or may not extend in whole or in part above an upper surface 124 of a dielectric layer 123. Upper ends 111 may have a slanted portion extending above a cylindrical shaft portion of wires of wire bond wires 108. Wire bond wires 108 may be of a bond via array, namely bond via array wires.

Dielectric layer 123 may be formed over wire bond wires 108 and surfaces 103-105. Dielectric layer 123 may be a molding or encapsulating layer of a molding or encapsulation material, respectively. For example, dielectric layer 123 may be formed by injection molding using a mold assist film to leave upper ends 111, in whole or in part, exposed after forming such a molding layer. Whether a dielectric layer 123 is implemented or not, such dielectric layer 123 may be above an upper surface of a substrate in contrast to a conventional SIW. Circuit structure 110, such as a waveguide for propagating an electromagnetic signal, may have air or generally a gas, or no dielectric medium at all (i.e., space or a vacuum), for propagating an electromagnetic signal.

A cover 121 may be formed on and/or above an upper surface 124 of dielectric layer 123 for interconnection with upper ends 111. Along those lines, a metal or other electrically conductive material may be plated, printed, deposited or otherwise formed on upper surface 124 for forming cover 121 while simultaneously interconnecting upper ends 111 with such cover 121.

Cover 121, in addition to being over an interior region 117 corresponding to interior surface 104, overlaps upper ends 111. Optionally, cover 121 may extend beyond upper ends 111 of wire bond wires, same or similarly to optionally having conductive layer 101 extend beyond interior surface 104 as generally indicated by upper surface 105. Along those lines, cover 121 may have an extension portion 138, such as an eave or overhang, which is outside of interior region 117 and extends beyond a sidewall defined by at least one plurality of wire bond wires 108 of such interior region 117. For example, extension portion 138 of conductive cover 121 may be laterally extend away from such a sidewall by an amount in a range of approximately 0.5*h1 to h1. Extension portion 138 may suppress "leakage" of electromagnetic field and reduce emission loss of signal. Along those lines, a longer extension portion 138 may generally provide enhanced suppression of leakage.

FIG. 3 is a block diagram illustratively depicting a cross-sectional view of an exemplary system-integrated package ("SiP") 130 having a uSIW circuit structure 110, such as previously described, for a microelectronic device 100. Substrate 102 may include a plurality of layers 131-1 through 131-N for forming conductive lines or traces. Respectively located between pairs of such plurality of layers 131-1 through 131-N may be a plurality of inter-dielectric layers 132-1 through 132-N. Along those lines, substrate 102 may be a multi-layer PCB formed of FR4 with copper traces or other form of substrate. With simultaneous reference to FIGS. 1-1 through 3, SiP 130 is further described.

On an uppermost layer 131-1 of substrate 102 may be a plurality of microelectronic components 133, such as a bank of capacitors 133-1 and an IC packaged die 133-2 for example, in addition to at least one circuit structure 110, which in this example is a uSIW circuit structure 110 for purposes of clarity by way of example and not limitation. For this example, a molding layer 123 may be formed covering in whole or in part one or more of microelectronic components 133. After forming molding layer 123, a cover 121 may be formed for uSIW circuit structure 110, which formation of cover 121 may optionally be followed by formation of a capping molding or encapsulation layer 135 over such cover 121 and an upper surface 124 of molding layer 123.

Figure 4:
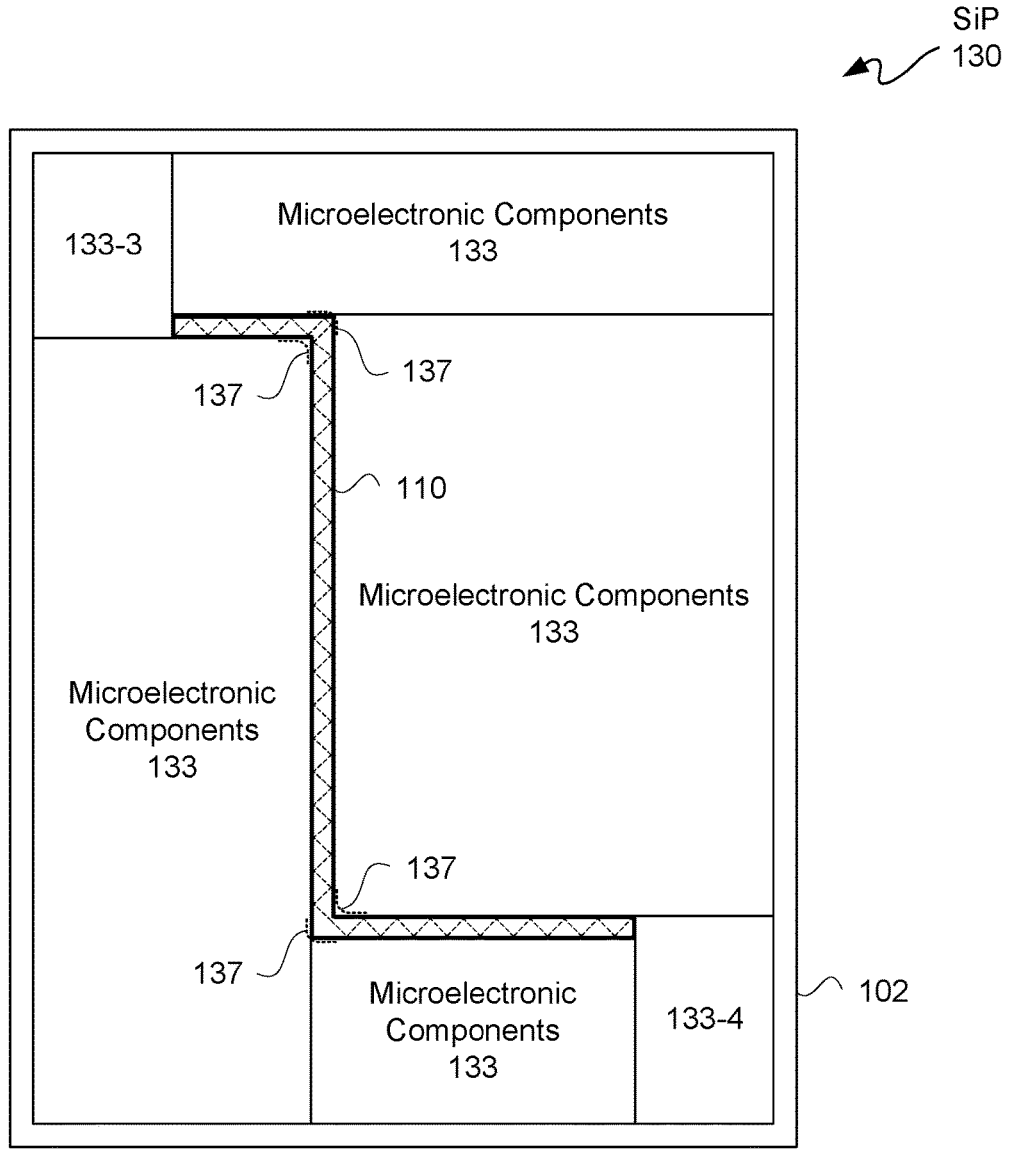
FIG. 4 is a block diagram illustratively depicting a top plan view of the example SiP of FIG. 3.

FIG. 4 is a block diagram illustratively depicting a top plan view of the example SiP 130 of FIG. 3. SiP 130 may have many microelectronic components, which for purposes of clarity are as generalized as blocks of microelectronic components 133, coupled to an upper surface of a substrate 102.

Two of such microelectronic components 133, namely RF circuit 133-3 and RF circuit 133-4, may be for communication of an RF signal 136 from one to the other. A uSIW circuit structure 110 may be coupled at one end to RF circuit 133-3 and at the other end to RF circuit 133-4 for communicating such RF signal 136. While an example signal path and waveguide path therefor is illustratively depicted for purposes of clarity, it should be understood that another type of signal path and/or waveguide path may be used. For example even though rectilinear corners are illustratively depicted for a uSIW circuit structure 110, in another implementation curved corners may be used as illustratively indicated with dashed lines 137. Though an RF signal 136 is described another type of electromagnetic waveguide signal, such as a millimeter-wave or microwave signal for an electromagnetic signal for example, may be used.

In this example, a high-frequency RF signal 136, namely with a wavelength less than approximately 1.5 mm, passes between many different microelectronic components 133. To provide a transmission line for a communication channel in a SiP 130 having low-loss and low crosstalk signal parameters, a uSIW circuit structure 110 may be used. For example, for RF signal 136 may have narrow bands at high frequencies making use of a uSIW circuit structure 110 desirable. Because a uSIW circuit structure 110 may be formed on a surface of substrate 102, no additional internal routing layer or layers need be added to substrate 102.

FIGS. 5 through 10 are respective block diagrams illustratively depicting respective top-down views of corresponding exemplary microelectronic devices 100 having a signal guide circuit structure 110 formed with wire bond wires 108. Each of FIGS. 5 through 10 is further described with simultaneous reference to FIGS. 1-1 through 4.

Figure 5:
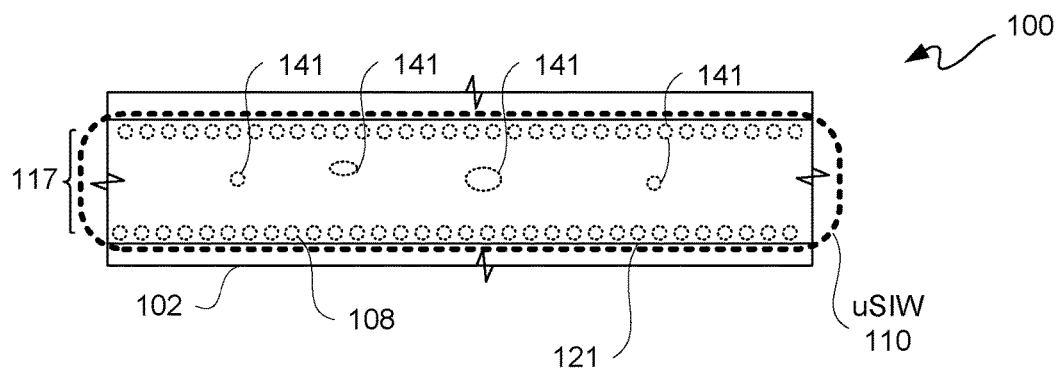
FIGS. 5 through 10 are respective block diagrams illustratively depicting respective top-down views of corresponding exemplary microelectronic devices having a signal guide circuit structure formed with wire bond wires.
Figure 6:
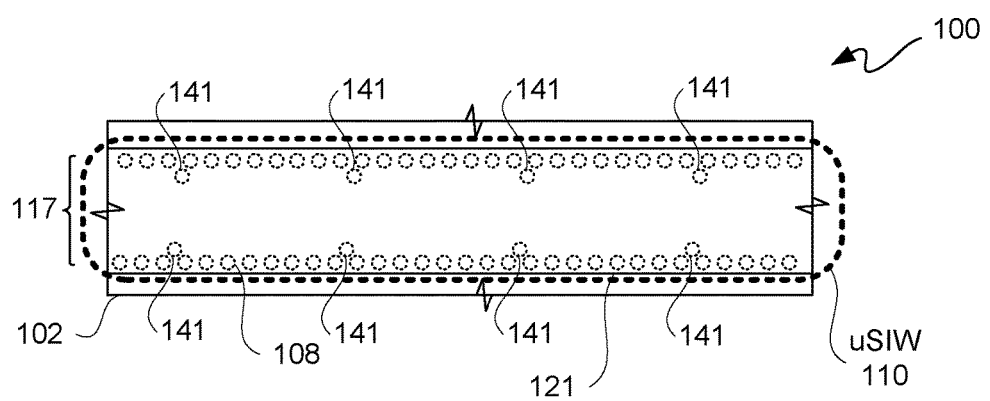

With reference to FIGS. 5 and 6, microelectronic device 100 includes a uSIW circuit structure 110, as previously, described, but additionally with one or more conductive structures 141 of same or different shapes from one another. Conductive structures 141 may be located in interior region 117, namely in a signal conduit or cavity of a circuit structure 110 generally between rows 116 and 117.

One or more of conductive structures 141 may be formed with wire bond wires 108 and/or by forming conductive vias in a dielectric layer 123. With respect to the latter, holes may be formed for interconnection of conductive vias as conductive structures to interior surface 104 for mechanical coupling therewith for electrical conductivity. A metal or other conductive material may be plated or otherwise deposited into such holes for forming conductive vias for conductive structures. This deposition may be a same deposition used to form cover 121.

In the example of microelectronic device 100 of FIG. 5, addition of conductive structures 141 in interior region 117 is for having interior conductive structures 141 couple lower interior surface 104 and upper interior surface 122 of interior region 117 for electrical conductivity to provide an inductive post filter. In the example of microelectronic device 100 of FIG. 6, addition of conductive structures 141 in interior region 117 is for having interior conductive structures 141 couple lower interior surface 104 and upper interior surface 122 of interior region 117 for electrical conductivity to provide an iris-coupled filter circuit structure 110.

Figures 1, 7:
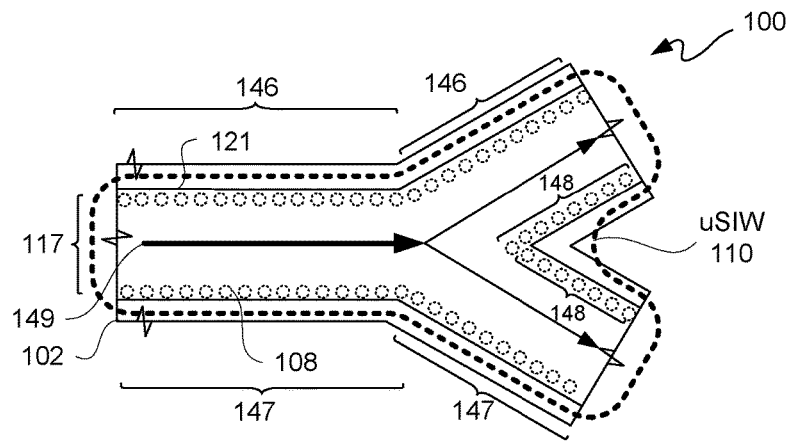
Figures 2, 7:
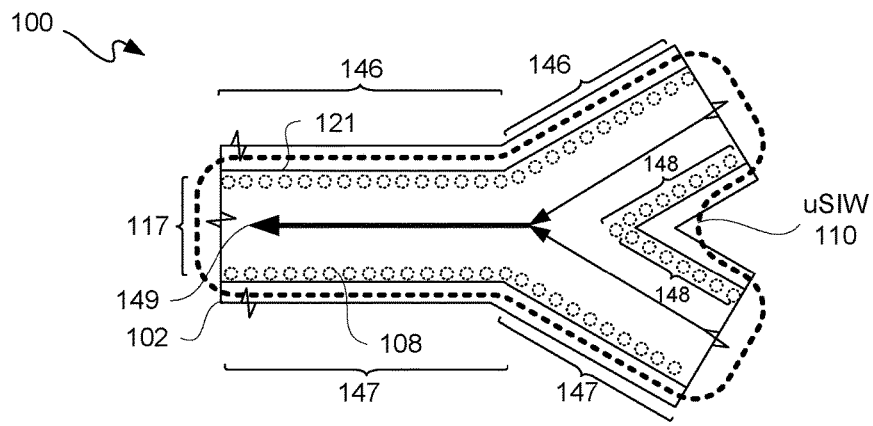
Figures 3, 7:
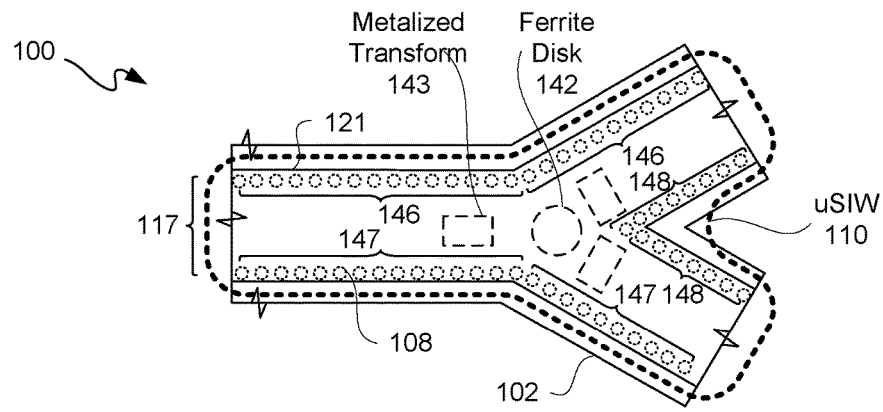

With reference to FIGS. 7-1 and 7-2, wire bond wires 108, as well as lower and upper conductive layers for a uSIW circuit structure 110 are used to form a Y-shaped structure. In another example, a T-shaped or other shaped structure may be formed. Along those lines, a splitter as in FIG. 7-1 or a coupler as in FIG. 7-2 as generally indicated by signal arrows 149 by may be implemented as a Y-shaped or T-shaped circuit structure 110. For these structures, a first set 146 of wire bond wires 108 is for a first outer side of such a Y-shaped or T-shaped circuit structure 110, and a second set of wire bond wires 147 is for a second outer side of such a Y-shaped or T-shaped circuit structure 110 opposite such first side outer side. A third set 148 of wire bond wires 108 is for a first inner side and a second inner side respectively opposite such first outer side and second outer side. For a Y-shaped circuit structure 110, optionally a ferrite disk 142 and metalized transforms 143 may be formed in interior region 117 to provide a circulator circuit structure 110 as in FIG. 7-3.

Figure 8:
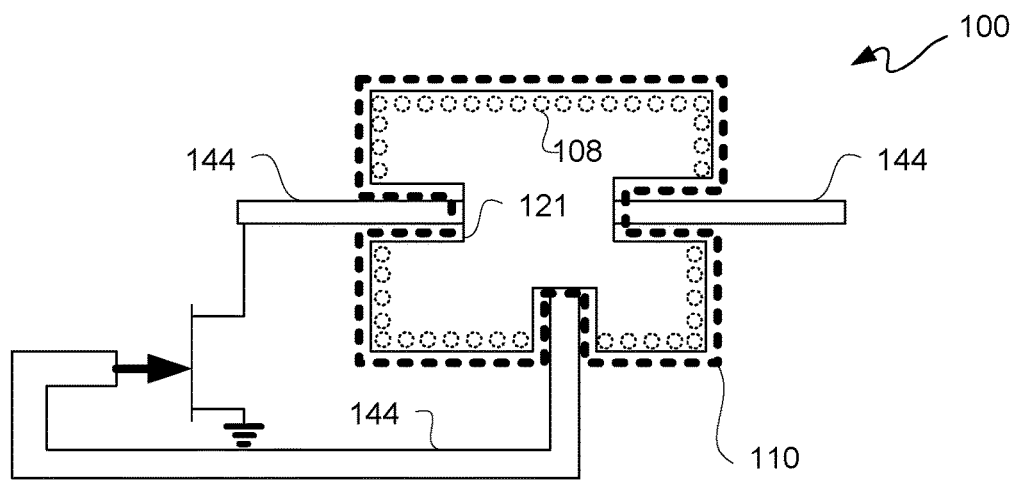

With reference to FIG. 8, a circuit structure 110 may be implemented for a positive feedback oscillator or other oscillator or a resonator for a microelectronic device 100. Along those lines, conductive lines 144, such as strip lines for example, may be provided to ports of circuit structure 110.

Figure 9:
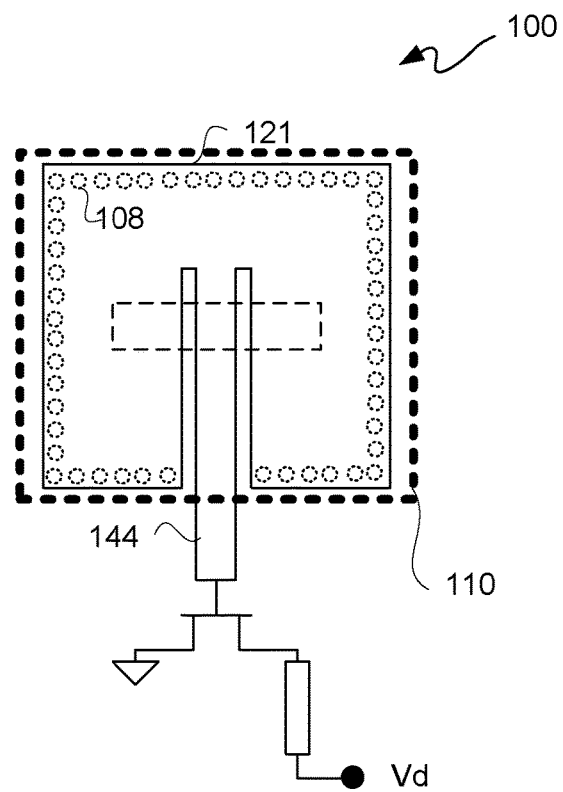

With reference to FIG. 9, a circuit structure 110 may be implemented for a cavity-backed active oscillator antenna or other antenna for a microelectronic device 100. Along those lines, conductive lines 144 may be provided to a port of circuit structure 110.

Figure 10:
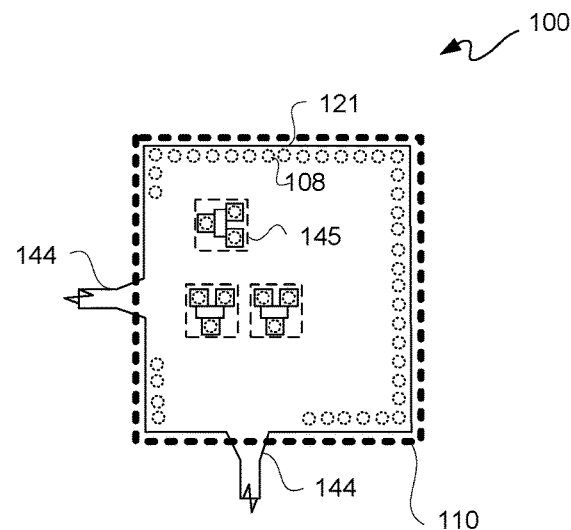

With reference to FIG. 10, a circuit structure 110 may be implemented for a tunable cavity for a microelectronic device 100. Along those lines, conductive lines 144 may be provided to ports of circuit structure 110, and one or more tuning elements 145 may be located in an internal region 117 of a tunable cavity circuit structure 110.

Either upper or lower ends of conductive structures 141, including wire bond wires and/or conductive vias, in interior region 117 may be spaced apart from either upper or lower interior surfaces, namely not shorted to either an upper or a lower conductive layer, for a transmitter or a receiver. Thus, for example, a set of interior wire bond wires used for conductive structures 141 may be interconnected to a lower interior surface 104 between rows 106 and 107 and may be shorter than outer wire bond wires 108 used to provide rows 106 and 107. Such set of interior wire bond wires used for conductive structures 141 may be completely covered with a dielectric layer 123, including upper ends thereof, so as not to come in direct contact with cover 121. Likewise, though in a reverse direction, holes for conductive structures 141 may not reach down to lower interior surface 104, leaving a portion of dielectric layer 123 between bottoms of such holes and lower interior surface 104.

Figure 11:
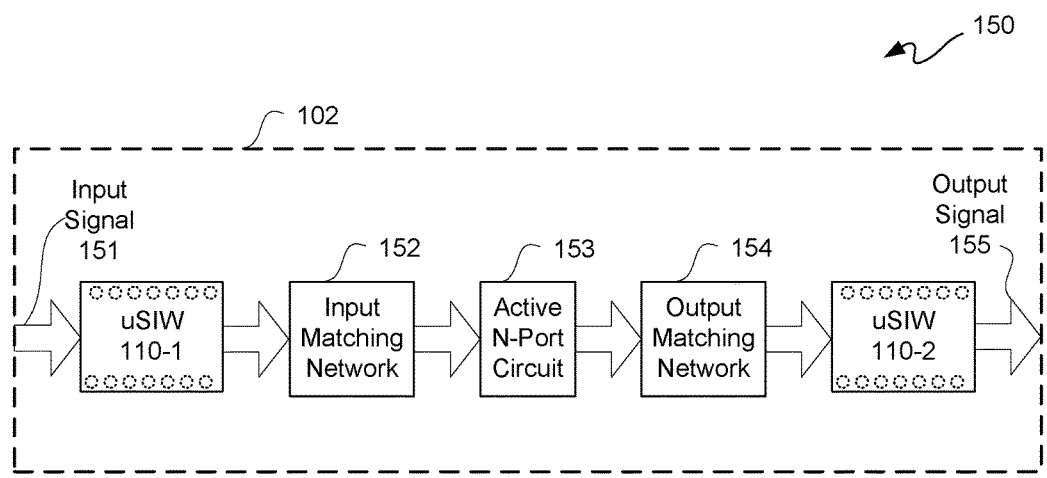
FIG. 11 is a block diagram illustratively depicting an exemplary amplifier system having a plurality of signal guide circuit structures.

FIG. 11 is a block diagram illustratively depicting an exemplary amplifier system 150 having a plurality of signal guide circuit structures 110, namely circuit structure 110-1 and 110-2 in this example. FIG. 11 is further described with simultaneous reference to FIGS. 1-1 through 11.

An input signal 151 is provided, such as by a strip line for example, to an ingress or input end or port of a uSIW circuit structure 110-1. An input matching network 152 may be coupled to an output or egress end or port of circuit structure 110-1, such as with a strip line or other signal conductive medium.

An active N-port or multi-port circuit 153 may be coupled to input matching network 152 to receive a signal therefrom. An output matching network 154 may be coupled to multi-port circuit 153 to receive a signal therefrom. Another uSIW circuit structure 110-2 may be coupled at an input or ingress port or end thereof to receive a signal from output matching network 154, such as via a strip line or other signal conductive medium. An output or egress end or port of circuit structure 110-2 may be coupled, such as with a strip line or other signal conductive medium, for sourcing an output signal 155 therefrom. Output signal 155 may be an amplified version of input signal 151, as amplifier system 150 may be an amplifier with a uSIW input and output.

Figure 12:
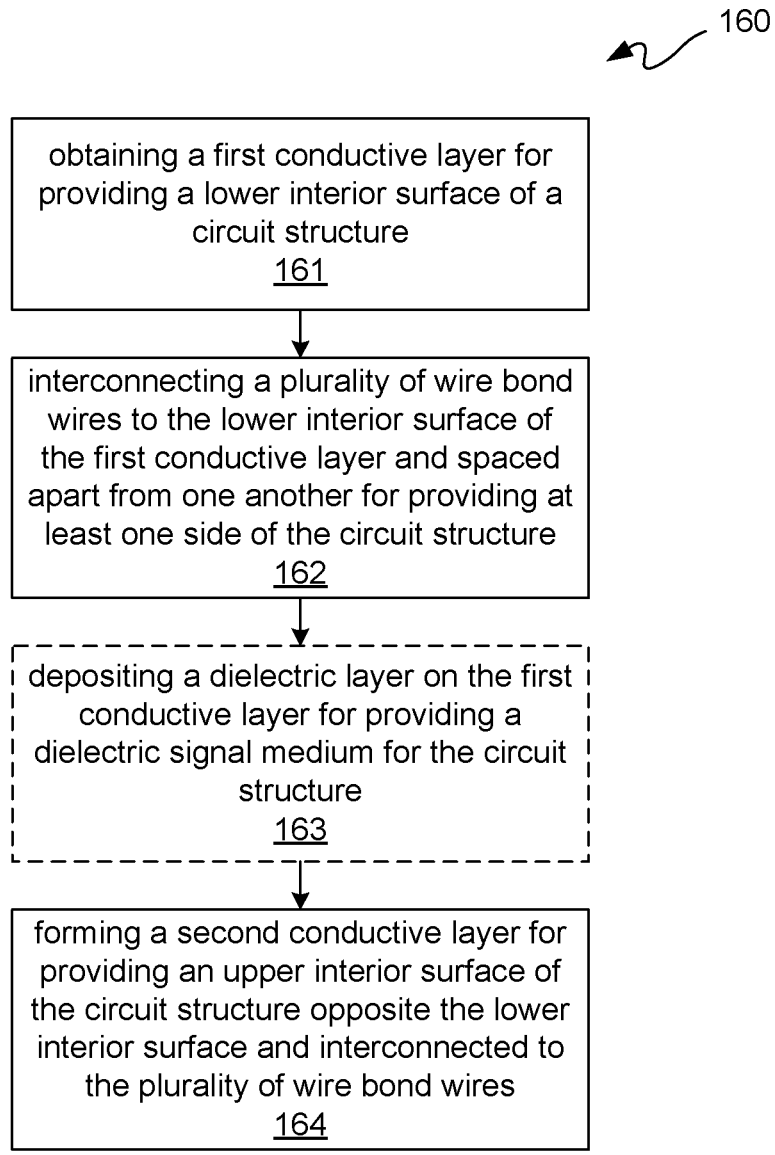
FIG. 12 is a flow diagram illustratively depicting an exemplary process flow for forming a microelectronic device for having a signal guide circuit structure.

FIG. 12 is a flow diagram illustratively depicting an exemplary process flow 160 for forming a microelectronic device 100 for having a circuit structure 110, as previously described. FIG. 12 is further described with simultaneous reference to FIGS. 1-1 through 12.

At operation 161 of process flow 160, a first conductive layer 101 may be obtained for providing a lower interior surface 104 of a circuit structure 110. At operation 162, a plurality of wire bond wires 108 may be interconnected to an upper surface 105 of first conductive layer 101, namely lower interior surface 104 of circuit structure 110. Such plurality of wire bond wires 108 may be spaced apart from one another by a distance d for providing at least one side of a circuit structure 110.

Optionally, at operation 163, a dielectric layer 123 may be deposited on upper surface 105 of first conductive layer 101 for providing a dielectric signal medium for circuit structure 110. Examples of dielectric materials that are commonly used for dielectric signal mediums include mold compounds, such as a G770 material for example.

At operation 164, a second or upper conductive layer, namely cover 121, may be formed for providing an upper interior surface 122 of circuit structure 110 opposite lower interior surface 104. Cover 121 may be interconnected to upper ends 111 of such a plurality of wire bond wires 108.

While the foregoing describes exemplary embodiment(s) in accordance with one or more aspects of the disclosure, other and further embodiment(s) in accordance with the one or more aspects of the disclosure may be devised without departing from the scope thereof, which is determined by the claim(s) that follow and equivalents thereof. Each claim of this document constitutes a separate embodiment, and embodiments that combine different claims and/or different embodiments are within the scope of the disclosure and will be apparent to those of ordinary skill in the art after reviewing this disclosure. Claim(s) listing steps do not imply any order of the steps. Trademarks are the property of their respective owners.

What is claimed is:

1. An apparatus for a microelectronic device, comprising:
   a first conductive layer for providing a lower interior surface of a circuit structure;

a plurality of wire bond wires interconnected to the lower interior surface of the first conductive layer with wire bonds and spaced apart from one another for providing at least one side of the circuit structure;

a second conductive layer for providing an upper interior surface of the circuit structure spaced apart from the lower interior surface by and interconnected to the plurality of wire bond wires; and the plurality of wire bond wires, the first conductive layer and the second conductive layer in combination defining at least one opening in the at least one side for a signal port of the circuit structure.

2. The apparatus according to claim 1, wherein the at least one opening is for electromagnetic signals with wavelengths in a range of approximately 0.5 to 1.5 mm for suppressing at least one of crosstalk, electromagnetic interference or electromagnetic radiation with wavelengths longer than 1.5 mm.

3. The apparatus according to claim 1, wherein the at least one opening is for electromagnetic signals with wavelengths in a range of approximately 0.5 to 3.0 mm for suppressing at least one of crosstalk, electromagnetic interference or electromagnetic radiation with wavelengths longer than 3.0 mm.

4. The apparatus according to claim 1, wherein the at least one opening is for electromagnetic signals with wavelengths in a range of approximately 3.0 to 15 mm for suppressing at least one of crosstalk, electromagnetic interference or electromagnetic radiation with wavelengths longer than 15 mm.

5. The apparatus according to claim 1, wherein the lower conductive layer is formed on or as part of an upper surface of a substrate.

6. The apparatus according to claim 5, wherein the circuit structure is for a cavity.

7. The apparatus according to claim 5, wherein the circuit structure is for a waveguide.

8. The apparatus according to claim 7, wherein the waveguide is for electromagnetic signals with wavelengths in a range of approximately 0.5 to 1.5 mm.

9. The apparatus according to claim 7, wherein the waveguide is for electromagnetic signals with wavelengths in a range of approximately 0.5 to 3.0 mm.

10. The apparatus according to claim 7, wherein the waveguide is for electromagnetic signals with wavelengths in a range of approximately 3 to 15 mm.

11. The apparatus according to claim 7, wherein:

the signal port is a first signal port;

the plurality of wire bond wires comprises a first set and a second set of the plurality of wire bond wires interconnected to the lower conductive layer and the upper conductive layer for providing a first side and a second side, respectively, opposite one another for the at least one side of the circuit structure; and the first set, the second set, the first conductive layer, and the second conductive layer in combination defining a first opening and a second opening for the at least one opening in the at least one side for the first signal port and a second signal port, respectively, of the circuit structure.

12. The apparatus according to claim 11, wherein the plurality of wire bond wires are spaced apart from one another by less than $1/10^{th}$ of a signal wavelength for use of the circuit structure with wavelengths less than approximately 1.5 mm.

* * * * *